US012652995B2

(12) United States Patent
Langer et al.

(10) Patent No.: US 12,652,995 B2
(45) Date of Patent: Jun. 9, 2026

(54) METHOD OF MANUFACTURING A SEMICONDUCTOR DEVICE

(71) Applicant: Infineon Technologies AG, Neubiberg (DE)

(72) Inventors: Gregor Langer, Wölfnitz (AT); Bernhard Goller, Villach (AT); Nilesha Mishra, Villach (AT); Matteo Piccin, Villach (AT); Franz-Josef Pichler, Villach (AT)

(73) Assignee: Infineon Technologies AG, Neubiberg (DE)

( * ) Notice: Subject to any disclaimer, the term of this patent is extended or adjusted under 35 U.S.C. 154(b) by 399 days.

(21) Appl. No.: 18/211,656

(22) Filed: Jun. 20, 2023

(65) Prior Publication Data

US 2024/0006218 A1      Jan. 4, 2024

(30) Foreign Application Priority Data

Jun. 30, 2022    (EP) ..................................... 22182281

(51) Int. Cl.
H01L 21/683 (2006.01)
H01L 21/304 (2006.01)
H01L 21/66 (2006.01)

(52) U.S. Cl.
CPC ...... H01L 21/6835 (2013.01); H01L 21/3043 (2013.01); H01L 22/14 (2013.01); H01L 2221/68318 (2013.01); H01L 2221/68381 (2013.01)

(58) Field of Classification Search
CPC . H01L 21/6835; H01L 21/3043; H01L 22/14; H01L 2221/68318; H01L 2221/68381; H01L 2221/68327; H01L 2224/03009; H01L 2224/06181; H01L 2224/32245; H01L 2924/13055; H01L 2924/13091; H01L 2221/68304
USPC ......................................................... 438/464
See application file for complete search history.

(56) References Cited

U.S. PATENT DOCUMENTS

| | | | |
|---|---|---|---|
| 5,217,566 A | 6/1993 | Pasch et al. | |
| 6,269,281 B1 | 7/2001 | Hwang et al. | |
| 6,534,419 B1 | 3/2003 | Ong | |
| 7,195,988 B2 * | 3/2007 | Nemoto | ................. H01L 21/78 438/464 |

(Continued)

FOREIGN PATENT DOCUMENTS

| | | |
|---|---|---|
| EP | 0204631 A3 | 5/1987 |
| JP | 2000008010 A | 1/2000 |

(Continued)

*Primary Examiner* — Vu A Vu
(74) *Attorney, Agent, or Firm* — Murphy, Bilak & Homiller, PLLC

(57) ABSTRACT

A method of manufacturing a semiconductor device in a semiconductor body is proposed. The method includes processing a semiconductor body at a first surface of the semiconductor body. The method further includes attaching the semiconductor body to a carrier via the first surface. The carrier includes an inner part and an outer part at least partly surrounding the inner part. The method further includes processing the semiconductor body at a second surface opposite to the first surface. The method further includes detaching the inner part of the carrier from the semiconductor body.

16 Claims, 5 Drawing Sheets

(56)  References Cited

U.S. PATENT DOCUMENTS

| | | | | |
|---|---|---|---|---|
| 7,863,104 B2 * | 1/2011 | Kroeninger | ......... | H01L 21/6835 |
| | | | | 438/114 |
| 7,892,947 B2 * | 2/2011 | Bradl | .................. | H01L 21/6836 |
| | | | | 438/455 |
| 8,993,410 B2 * | 3/2015 | Henley | ................. | H10F 71/121 |
| | | | | 438/464 |
| 9,576,931 B1 * | 2/2017 | Shih | ...................... | H01L 21/561 |
| 10,366,970 B2 * | 7/2019 | Sekar | .................... | H01L 23/481 |
| 10,529,612 B2 * | 1/2020 | Santos Rodriguez | .. | B24B 37/32 |
| 10,643,897 B2 * | 5/2020 | Rupp | .................... | H01L 21/322 |
| 11,651,974 B2 * | 5/2023 | Kuo | ...................... | H01L 21/561 |
| | | | | 438/113 |
| 12,062,533 B2 * | 8/2024 | Priewasser | ........ | H01L 21/02005 |
| 2005/0236693 A1 | 10/2005 | Kröninger et al. | | |
| 2009/0098684 A1 | 4/2009 | Kroeninger et al. | | |
| 2019/0363057 A1 * | 11/2019 | Santos Rodriguez | .. | H01L 23/16 |
| 2021/0358736 A1 | 11/2021 | Priewasser | | |

FOREIGN PATENT DOCUMENTS

| | | | |
|---|---|---|---|
| JP | 2000129227 A | 5/2000 | |
| JP | 2004274008 A | 9/2004 | |
| WO | 2005053017 A1 | 6/2005 | |

* cited by examiner

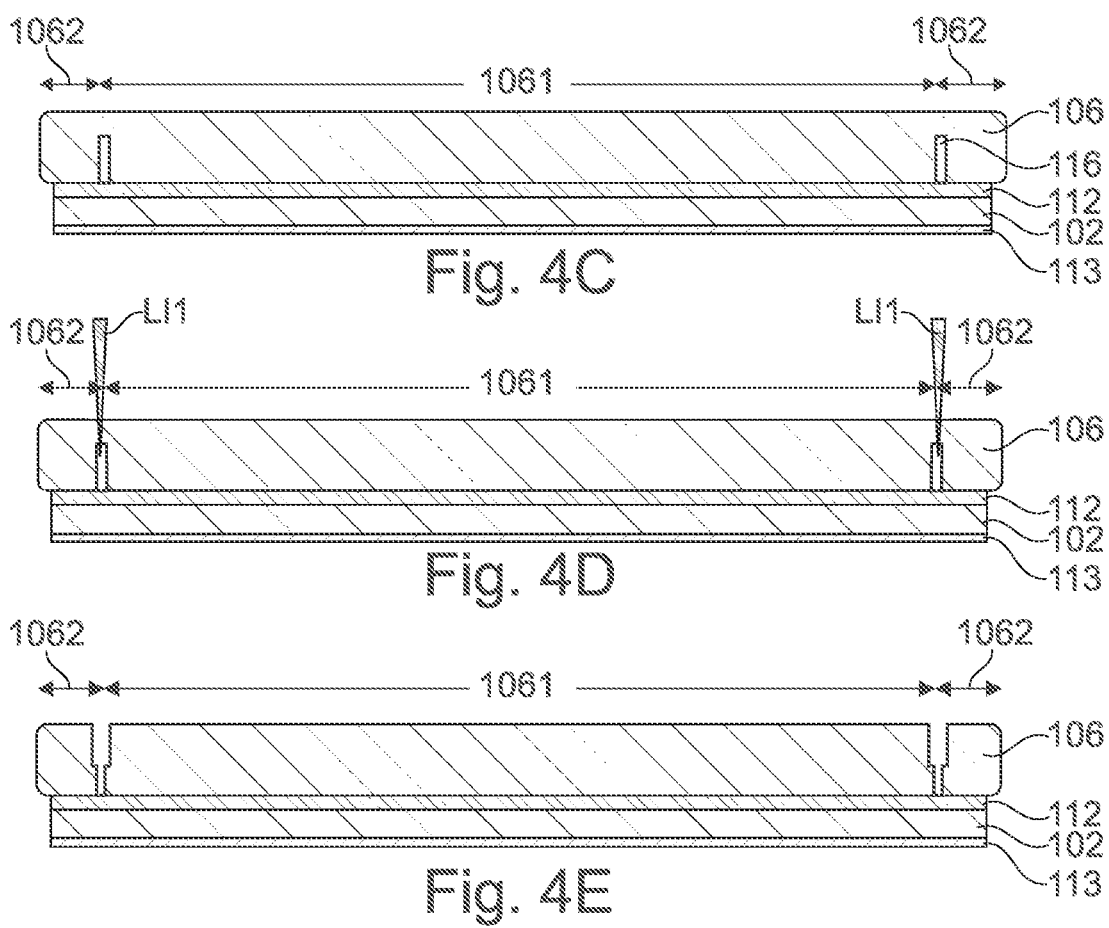
Fig. 4C
Fig. 4D
Fig. 4E
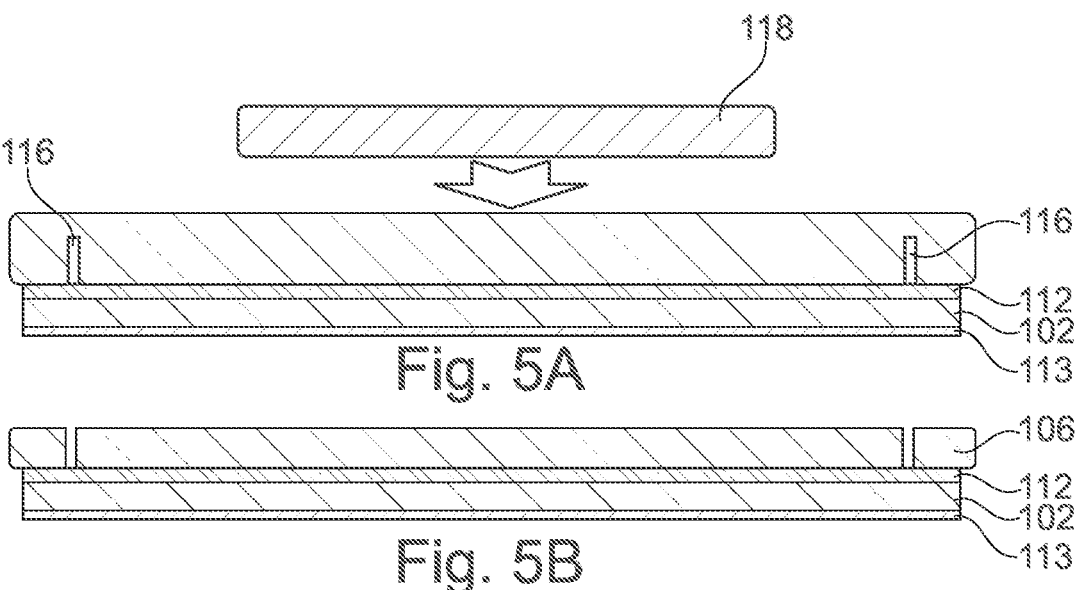
Fig. 5A
Fig. 5B

METHOD OF MANUFACTURING A SEMICONDUCTOR DEVICE

TECHNICAL FIELD

The present disclosure relates to a method of manufacturing a semiconductor device, in particular to a method including processing a semiconductor body at opposite sides of the semiconductor body.

BACKGROUND

Semiconductor wafers are typically available in standard wafer sizes and/or thicknesses. For example, standard wafer diameters may be 2 inch (50 mm), 4 inch (100 mm), 6 inch (150 mm), or 8 inch (200 mm), or even larger. For example, in power semiconductor devices with a vertical load current flow between a front side and a back side of a chip or die, the wafers are processed at the front side and at the back side. Processing wafers at the front side and the back side typically has to meet many, partially conflicting, requirements for meeting demands on chip reliability. For example, requirements on cost reduction by reducing process complexity may be in conflict with mechanical stability of the wafers during semiconductor processing.

Thus, there is a need for improving flexibility of manufacturing a semiconductor device.

SUMMARY

An example of the present disclosure relates to a method of manufacturing a semiconductor device. The method includes processing a semiconductor body at a first surface of the semiconductor body. The method further includes attaching the semiconductor body to a carrier via the first surface. The carrier includes an inner part and an outer part at least partly surrounding the inner part. The method further includes processing the semiconductor body at a second surface opposite to the first surface. The method further includes detaching the inner part of the carrier from the semiconductor body.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of manufacturing semiconductor devices and together with the description serve to explain principles of the examples. Further examples are described in the following detailed description and the claims.

FIG. 2 is a schematic cross-sectional view for illustrating a process feature of accessing the semiconductor body via the first surface for testing.

FIGS. 3A to 3G, 4A to 4E, 5A and 5B, and 6A to 6G are schematic cross-sectional views for illustrating process features of manufacturing a semiconductor device.

DETAILED DESCRIPTION

Figures 1A, 1B, 1C, 1D:
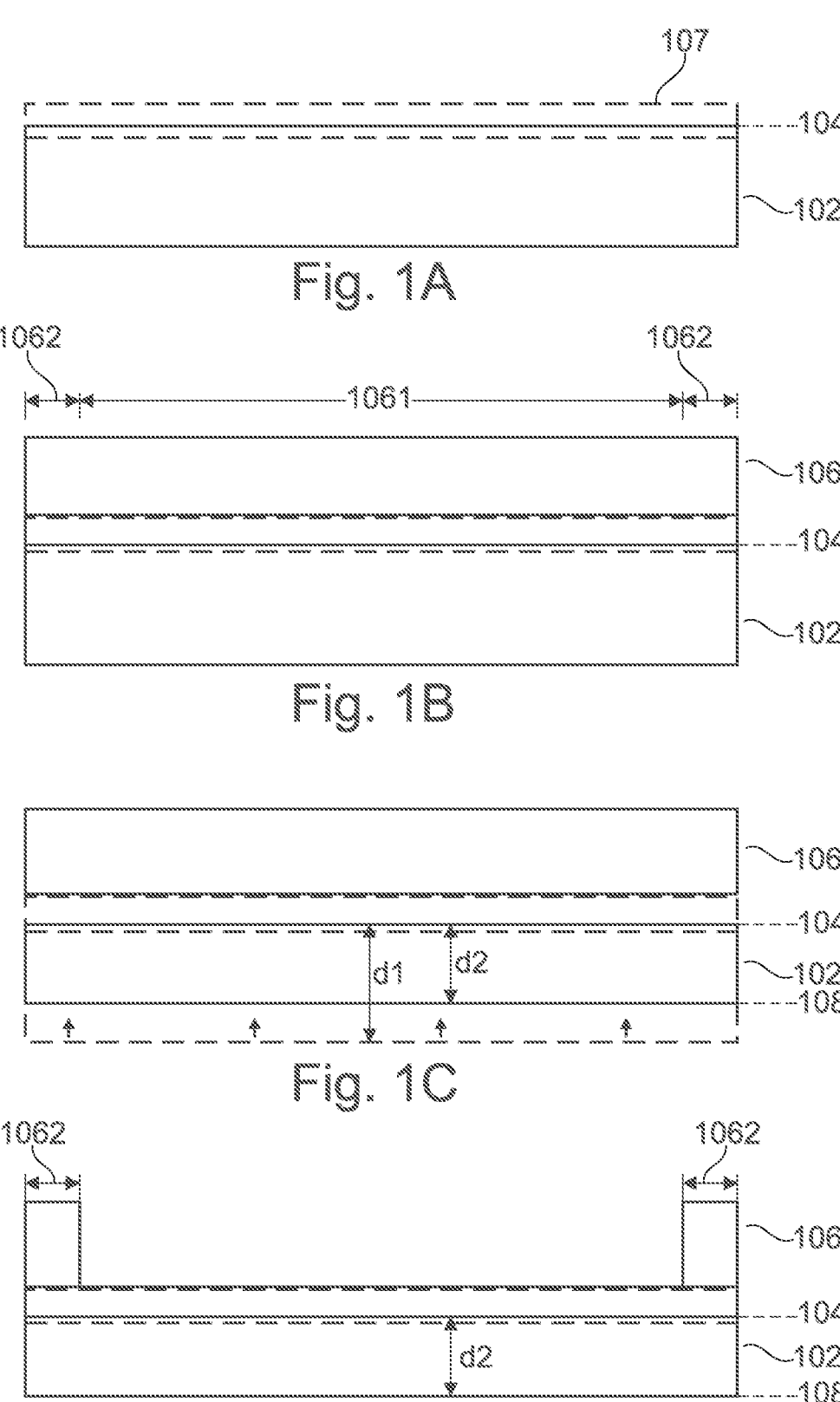
FIGS. 1A to 1D are schematic cross-sectional views for illustrating process features of manufacturing a semiconductor device.

In the following detailed description, reference is made to the accompanying drawings, which form a part hereof and in which are shown by way of illustrations specific examples of manufacturing semiconductor devices. It is to be understood that other examples may be utilized and structural or logical changes may be made without departing from the scope of the present disclosure. For example, features illustrated or described for one example can be used in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

Ranges given for physical dimensions include the boundary values. For example, a range for a parameter y from a to b reads as a s y s b. The same holds for ranges with one boundary value like "at most" and "at least".

The terms "on" and "over" are not to be construed as meaning only "directly on" and "directly over". Rather, if one element is positioned "on" or "over" another element (e.g., a layer is "on" or "over" another layer or "on" or "over" a substrate), a further component (e.g., a further layer) may be positioned between the two elements (e.g., a further layer may be positioned between a layer and a substrate if the layer is "on" or "over" said substrate).

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

An example of a method of manufacturing a semiconductor device may include processing a semiconductor body at a first surface of the semiconductor body. The method may further include attaching the semiconductor body to a carrier via the first surface. The carrier includes an inner part and an outer part at least partly surrounding the inner part. The method may further include processing the semiconductor body at a second surface opposite to the first surface. The method may further include detaching the inner part of the carrier from the semiconductor body.

The semiconductor device may be an integrated circuit, or a discrete semiconductor device or a semiconductor module, for example. The semiconductor device may be or may include a power semiconductor device, e.g. a vertical power semiconductor device having a load current flow between the first surface and the second surface. The semiconductor device may be used in automotive, industrial power control, power management, sensing solutions and security in Internet of Things applications, for example. The semiconductor device may be or may include a power semiconductor diode, or a power semiconductor IGBT (insulated gate bipolar transistor), or a reverse conducting (RC) IGBT, or a power semiconductor transistor such as a power semiconductor IGFET (insulated gate field effect transistor, e.g. a metal oxide semiconductor field effect transistor). The power semiconductor device may be configured to conduct currents of more than 1 A or more than 10 A or even more than 30 A. For realizing a desired maximum load current, the semiconductor device may be designed by a plurality of parallel-connected cells. The parallel-connected cells may, for example, be transistor or diode cells formed in the shape of a strip or a strip segment. Of course, the device cells can also have any other shape, e.g., circular, elliptical, polygonal such as octahedral. The semiconductor device may be further configured to block voltages between load terminals, e.g. between emitter and collector of an IGBT, or between cathode and anode of a diode, or between drain and source of a MOSFET, in the range of several tens, or several hundreds, or up to several thousands of volts, e.g. 30V, 40V, 60V, 80V, 100V, 400 V, 650V, 1.2 kV, 1.7 kV, 3.3 kV, 4.5 kV, 5.5 kV, 6 kV, 6.5 kV, 10 kV. The blocking voltage may correspond to a voltage class specified in a datasheet of the power semiconductor device, for example. The semiconductor device may also be or may also include a lateral semiconductor device, e.g. a lateral power semiconductor device, having a load current flow along a lateral direction, e.g. parallel to the first surface.

For example, the semiconductor device may be implemented monolithically using a mixed technology. Such mixed technologies can be used, for example, to form analog circuit blocks in a chip by the bipolar devices included in this technology for providing interfaces to digital systems, and to form digital circuit blocks by the complementary metal-oxide-semiconductor (CMOS) devices included in this technology for providing signal processing, and to form low-, medium- or high-voltage or power blocks by field effect transistors included in this technology. Such mixed technologies are known, for example, as bipolar CMOS-DMOS, BCD technologies or smart power technologies, SPT, and are used in a variety of application areas in the field of e.g. lighting, motor control, automotive electronics, power management for mobile devices, audio amplifiers, power supply, hard disks, printers. The semiconductor device may be part of a discrete, BCD or Smart Power chip in one of the above application fields, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). The semiconductor body may comprise or may be an epitaxially deposited semiconductor material. Separately or in combination, the semiconductor body may comprise a growth substrate.

The first surface may be a front surface or a top surface of the semiconductor body, and the second surface may be a back surface or a rear surface of the semiconductor body, for example. The semiconductor body may be attached to a lead frame via the second surface, for example. Over the first surface of the semiconductor body, interconnects may be arranged on a contact pad structure of a wiring area for electrically connecting device elements in the semiconductor body to elements, e.g. other semiconductor devices, outside of the semiconductor device, for example.

Processing the semiconductor body at the first surface may include forming semiconductor device elements in the semiconductor body. For example, processing the semiconductor body at the first surface may include at least one doping process for forming doped regions in the semiconductor body. The at least one doping process may include an ion implantation process followed by a thermal activation of dopants, a diffusion process introducing the dopants into the semiconductor from a dopant source (e.g. solid or gaseous diffusion source), an in-situ doping process when forming a semiconductor layer, e.g. by a layer deposition process, on a semiconductor substrate such as a wafer, of the semiconductor body. The exemplary doping processes may be combined in any way and may be repeated in any way, e.g. depending on a desired number and profile of the doped regions that are to be formed in the semiconductor body at the first surface. Exemplary doped regions are source and drain regions, or emitter and collector regions, body region(s), body contact region(s), current spread region(s), shielding region(s) configured to shield a gate dielectric from high electric fields, field stop region(s). Forming semiconductor device elements in the semiconductor body by processing the semiconductor body at the first surface may also include trench etch processes. The trench etch processes may be used to form trenches such as gate electrode trenches, field electrode trenches, multi-electrode trenches (e.g. combining gate and field electrodes in one trench), trenches for edge termination structures, contact trenches for providing an electric contact to doped regions in the semiconductor body. Forming semiconductor device elements in the semiconductor body by processing the semiconductor body at the first surface may also include forming insulating layer(s), conductive layer(s), or any combination thereof, in the trenches. Exemplary insulating or conductive layers include, inter alia, gate or field electrodes by doped semiconductor layers (e.g. doped polycrystalline silicon, or metal, or metal alloy), oxide layers (e.g. silicate glass, deposited $SiO_2$, thermal $SiO_2$), nitride layers (e.g., $Si_3N_4$), high-k dielectric layers, low-k dielectric layers, dielectric spacers, or any combination thereof.

Processing the semiconductor body at the first surface may further include forming a wiring area over the first surface of the semiconductor body. Forming a wiring area may include forming one or more than one, e.g. two, three, four or even more wiring levels. Each wiring level may be formed by a single one or a stack of conductive layers, e.g. metal layer(s). For example, the wiring levels may include at least one of Cu, Au, AlCu, Ag, or alloys thereof. The wiring levels may be lithographically patterned, for example. Between stacked wiring levels, an interlayer dielectric structure may be formed. Openings may be formed in the interlayer dielectric structure for electrically interconnecting different wiring layers. For example, contact plug(s), or contact via(s) or contact line(s) may be formed in the openings in the interlayer dielectric structure to electrically connect parts, e.g. metal lines or contact areas, of different wiring levels to one another. The wiring area may be arranged over an active area of the semiconductor body. The active area may be an area where the device elements in the semiconductor body, e.g. a transistor or diode cell array of a vertical power semiconductor device (e.g. a power IGBT, a power MOSFET, a power thyristor, or a power diode), are electrically connected to the wiring area via the first surface. Apart from the active area, the semiconductor device may also include an edge termination area that at least partly surrounds the active area. The edge termination area may include a termination structure. In a blocking mode or in a reverse biased mode of the semiconductor device, the blocking voltage between the active area and a field-free region laterally drops across the termination structure. The termination structure may have a higher or a slightly lower voltage blocking capability than the active area. The termination structure may include a junction termination extension (JTE) with or without a variation of lateral doping (VLD), one or more laterally separated guard rings, or any combination thereof, for example. The wiring area may laterally adjoin to a passivation area that may be arranged over the edge termination area of a vertical power semiconductor device, for example.

The semiconductor body may be attached to the carrier via the first surface in at least part of an area between the carrier and the semiconductor body. For example, the carrier may be an organic, inorganic, or hybrid material, for example a glass carrier or a SiC carrier. The semiconductor body may be attached to the carrier via the wiring area by at least one of electrostatic force, adhesive force, or magnetic force. For example, a glue may be used for attaching the semiconductor body to the carrier via the first surface in at least part of an area between the carrier and the semiconductor body. The inner part of the carrier may have a larger surface area than the outer part of the carrier. For example, the inner part of the carrier may at least cover an active area of the semiconductor body. The outer part of the carrier may fully or at least partly surround the inner part of the carrier. The outer part of the carrier may at least be large enough for providing mechanical stability during subsequent testing or handling processes with the inner part of the carrier being removed.

Processing the semiconductor body at a second surface opposite to the first surface may include at last one of reducing a thickness of the semiconductor body by removing material from the second surface of the semiconductor body, e.g. by chemical and/or mechanical processes such as etching or grinding, implantation of ions through the second surface into the semiconductor body for introducing ions of a doping element, or ions, which induce doping by complex formation, irradiating a surface region of the semiconductor body at the second surface with a plurality of laser pulses for adjusting temperature profiles in the semiconductor body by the laser irradiation process (e.g. number of laser pulses, energy of laser pulses, repetition rate, and by varying the parameters during the laser irradiation process of a specific surface region of the semiconductor body at the second surface), or forming a wiring area over the second surface.

Detaching the inner part of the carrier from the semiconductor body may, for example, include at least one of chemical soaking, chemical dissolving, temperature, electromagnetic radiation, mechanical, magnetic, or electric forces.

By altering the structure of a carrier in a semiconductor manufacturing process involving processing a semiconductor body at opposite first and second surfaces, flexibility of manufacturing a semiconductor device may be increased by lowering hurdles in processing a semiconductor body that are caused by preceding processes carried out to the semiconductor body. For example, by altering the structure of a carrier in a semiconductor manufacturing process involving processing a semiconductor body at opposite first and second surfaces, flexibility of the manufacturing process may be increased by using the carrier not only for processing of the semiconductor body, e.g. through a rear or back side of the semiconductor body, but also for assessing the semiconductor body through the side where the carrier is mounted to the semiconductor body at a later stage, e.g. for testing purposes.

For example, the method may further include testing electric characteristics by bringing at least one probe into electric contact with the semiconductor body from a side of the semiconductor body where the outer part of the carrier is attached to the semiconductor body. For example, a probe card of a wafer prober may be brought into electrical contact with process control monitor (PCM) test structures on the semiconductor body, e.g. in a chip saw frame, for characterizing and controlling the manufactured technology in reference to the technology specification.

For example, processing the semiconductor body at the first surface may include at least one of introducing dopants into the semiconductor body through the first surface, forming a wiring area including a plurality of contact pads over the first surface of the semiconductor body, or forming trenches in the semiconductor body at the first surface.

For example, processing the semiconductor body at the second surface may include reducing a thickness of the semiconductor body by removing material from the second surface of the semiconductor body.

For example, detaching the inner part of the carrier from the semiconductor body may include separating the inner part from the outer part of the carrier by removing material of the carrier. For example, material of the carrier may be removed by an abrasive cutting process. e.g. grinding, and/or by laser cutting, and/or by a chemical removal process, e.g. Laser Induced Deep Etching (LIDE).

For example, removing material of the carrier may include laser irradiating of a separation region between the inner part and the outer part of the carrier.

For example, before the laser irradiation, a laser irradiation or chemical stopping structure may be formed over the first surface of the semiconductor body in the separation region and/or on a surface of the carrier in the separation region. The carrier may be attached to the semiconductor body via the surface of the carrier including the laser irradiation or chemical stopping structure. For example, the laser irradiation or chemical stopping structure may be configured to hinder the laser irradiation or chemical etch process from penetrating into the semiconductor body and damaging the semiconductor body or device elements included therein. A metal layer or metal layer stack absorbing excessive energy of the laser irradiation may act as laser irradiation or chemical stopping structure, for example. In some examples, in addition to or as an alternative to the laser irradiation or chemical stopping structure being part of the semiconductor body, the laser irradiation or chemical stopping structure may also be formed on a surface of the carrier, e.g. the surface which is attached on the semiconductor body.

For example, the carrier may include a groove or recess on a surface of the carrier in the separation region. The carrier may be attached to the semiconductor body via the surface including the groove. By providing the carrier with a groove in the separation region, the amount of carrier material to be removed for separating the carrier into the inner and outer part may be reduced. This may allow for simplifying the process of detaching the inner part of the carrier from the semiconductor body, for example.

For example, the carrier may include a groove on a surface of the carrier in a separation region between the inner part and the outer part of the carrier. The carrier may be attached to the semiconductor body via the surface including the groove. Material of the carrier may be removed by abrasive machining, e.g. grinding, from a surface opposite to the groove for exposing the groove and separating the inner part from the outer part of the carrier.

For example, detaching the inner part of the carrier from the semiconductor body may include laser irradiation on the inner part of the carrier. For example, the laser irradiation of the inner part of the carrier may be involved in detaching the inner part of adhesive to a glass carrier interface with laser irradiation using a Light-To-Heat-Conversion release coating (LTHC being a 3M™).

For example, detaching the inner part of the carrier from the semiconductor body may include removing an adhesion layer between the inner part of the carrier and the semiconductor body by introducing an etch solution into holes extending through the carrier.

For example, detaching the inner part of the carrier from the semiconductor body may include removing a water soluble layer between the inner part of the carrier and the semiconductor body by dissolving the water soluble layer with water.

For example, the semiconductor body may be attached to the carrier via an adhesive layer arranged between the carrier and the semiconductor body with respect to the inner part and the outer part of the carrier.

For example, the semiconductor body may be attached to the carrier via an adhesive layer arranged between the carrier and the semiconductor body with respect to the outer part of the carrier. A water soluble layer may be arranged between the carrier and the semiconductor body with respect to the inner part of the carrier.

For example, the outer part of the carrier may be ring-shaped.

The examples and features described above and below may be combined. Functional and structural details (e.g. materials, dimensions) described with respect to the examples above shall likewise apply to the examples illustrated in the figures and described further below.

The examples and features described above and below may be combined.

More details and aspects are mentioned in connection with the examples described above or below. Processing a semiconductor body, e.g. a wafer, may comprise one or more optional additional features corresponding to one or more aspects mentioned in connection with the proposed concept or one or more examples described above or below.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

FIGS. 1A to 1D are schematic cross-sectional views for illustrating process features of a method of manufacturing a semiconductor device.

Referring to the schematic cross-sectional view of FIG. 1A, a semiconductor body 102 is processed at a first surface 104 of the semiconductor body 102. Thereby, semiconductor device elements may be formed in and/or over the semiconductor body 102 at the first surface 104. In the schematic cross-sectional view of FIG. 1A, the semiconductor device elements are illustrated in a simplified manner by reference symbol 107 identifying the region where the device elements are formed.

Referring to the schematic cross-sectional view of FIG. 1B, the semiconductor body 102 is attached to a carrier 106 via the first surface 104. The carrier 106 includes an inner part 1061 and an outer part 1062 at least partly surrounding the inner part 1061.

Referring to the schematic cross-sectional view of FIG. 1C, the semiconductor body 102 is processed at a second surface 108 opposite to the first surface 104. In the illustrated example, processing the semiconductor body 102 at the second surface 108 includes reducing a thickness of the semiconductor body 102 from a first thickness d1 to a second thickness d2 by removing material from the second surface 108 of the semiconductor body 102.

Referring to the schematic cross-sectional view of FIG. 1D, the inner part 1061 of the carrier 106 is detached from the semiconductor body 102. Detaching the inner part 1061 of the carrier 106 from the semiconductor body 102 enables access to the semiconductor body 102, e.g. device elements, via the first surface 104 of the semiconductor body 102 after manufacturing processes at the second surface 108.

Figures 2, 3A, 3B, 3C, 3D:
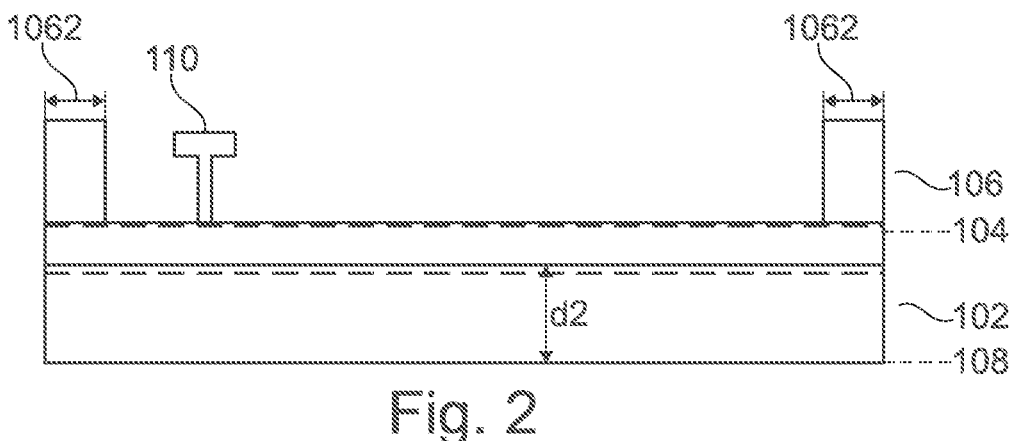

One example of accessing the semiconductor body 102 via the first surface 104 is illustrated in the schematic cross-sectional view of FIG. 2 by a schematic and exemplary test pin 110 that may be part of a probe card of a wafer prober.

The schematic cross-sectional views of FIGS. 3A to 3G illustrate exemplary details of process features of manufacturing a semiconductor device starting after processing the semiconductor body 102 at the first surface 104 as is schematically illustrated in FIG. 1A.

Referring to the schematic cross-sectional view of FIG. 3A, the carrier 106 is attached to the semiconductor body 102 via an adhesion layer 112, e.g. an LTHC layer/glue stack. A laser irradiation or chemical stopping structure 114 is formed over the first surface 104 of the semiconductor body 102 in a separation region between the inner part 1061 and the outer part 1062 of the carrier 106. For example, the outer part 1062 of the carrier 106 may be a carrier ring. Processing of the semiconductor body 102 at the second surface 108 may include, inter alia, reducing a thickness of the semiconductor body 102, and forming a contact layer 113, e.g. a metallization layer or metallization layer stack, on the second surface 108 of the semiconductor body 102. The contact layer 113 may be or may be part of a wiring area over the second surface 108 of the semiconductor body 102.

Referring to the schematic cross-sectional views of FIGS. 3B, 3C, the carrier 106 is irradiated with laser irradiation LI1 at a position of the laser irradiation or chemical stopping structure 114. The laser irradiation LI1 causes removal of material of the carrier 106 and laterally separates the carrier 106 into the inner part 1061 and the outer part 1062 by laser cutting.

Referring to the schematic cross-sectional view of FIG. 3D, the adhesion layer 112 is irradiated with laser irradiation LI2 through the carrier 106 in the inner part 106 of the carrier 106 (schematically illustrated by an arrow 115 indicating the scan direction of the laser irradiation LI2). The laser irradiation LI2 in combination with the LTHC layer of the adhesion layer 112 enables a debonding of the carrier 106 from the semiconductor body 102. The laser irradiation LI2 may differ from the laser irradiation LI1 with respect to parameters such as laser wavelength, laser pulse energy, pulse repetition rate, for example.

Figures 3E, 3F, 3G, 4A, 4B:
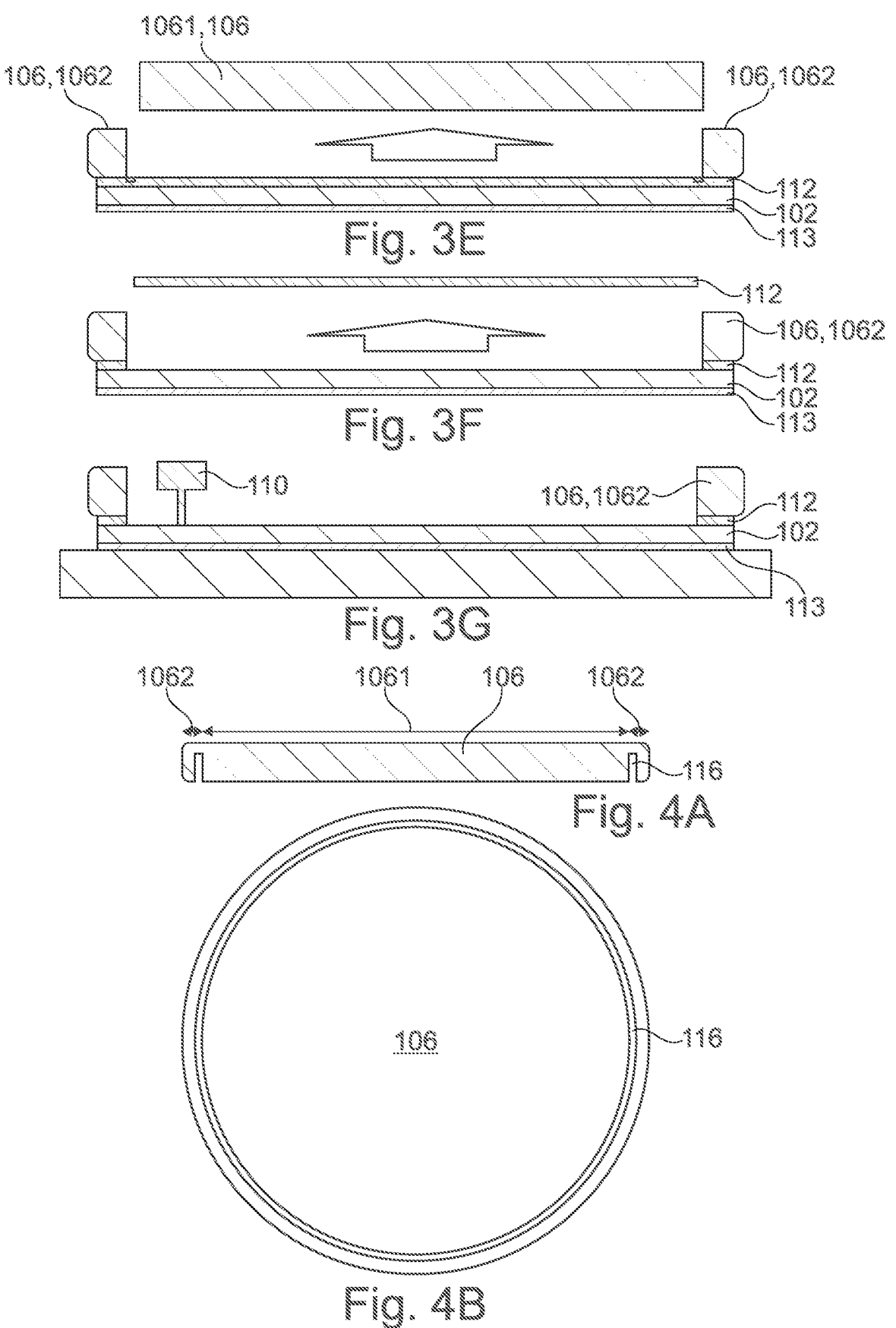

Referring to the schematic cross-sectional view of FIG. 3E, the inner part 1061 of the carrier 106 is detached from the semiconductor body 102.

Referring to the schematic cross-sectional view of FIG. 3F, the adhesion layer 112 is detached from the semiconductor body 102 in an area of the inner part 1061 of the carrier 106.

Referring to the schematic cross-sectional view of FIG. 3G, the semiconductor body 102 is accessed via the first surface 104 by an exemplary test pin 110 in an area where the inner part 1061 of the carrier 106 has been removed. The test pin 110 may be part of a probe card of a wafer prober, for example.

The schematic cross-sectional views of FIGS. 4A to 4E illustrate further exemplary details of process features of manufacturing a semiconductor device starting after processing the semiconductor body 102 at the first surface 104 as is schematically illustrated in FIG. 1A.

Referring to the schematic cross-sectional views of FIGS. 4A, 4B, a carrier 106 is provided that includes a groove 116 on a surface of the carrier 106 in a separation region between the inner part 1061 and the outer part 1062 of the carrier 106. The groove 116 may be formed by laser cutting, etching or abrasive machining, for example.

Referring to the schematic cross-sectional view of FIG. 4C, the carrier 106 is attached to the semiconductor body 102 via the surface including the groove 116 (see also description related to FIG. 3A).

Referring to the schematic cross-sectional views of FIGS. 4D, 4E, the carrier 106 is irradiated with laser irradiation LI1 at a lateral position of the groove 116. The laser irradiation LI1 causes removal of material of the carrier 106 and separates the carrier 106 into the inner part 1061 and the outer part 1062 by laser cutting.

Further process features, for example process features described with reference to FIGS. 3D to 3G, may follow the process feature illustrated in FIG. 4E.

As an alternative or supplementary to the process features illustrated in FIGS. 4C to 4E, separation of the carrier 106 into the inner part 1061 and the outer part 1062 may also be carried out based on the schematic process features illustrated in FIGS. 5A and 5B.

Referring to the schematic cross-sectional views of FIGS. 5A, 5B, material of the carrier 106 is removed by an abrasive machining tool 118, e.g. a grinding wheel, from a surface opposite to the groove 116 for exposing the groove 116 and separating the inner part 1061 from the outer part 1062 of the carrier 106.

The schematic cross-sectional views of FIGS. 6A to 6G illustrate exemplary details of process features of manufacturing a semiconductor device starting after processing the semiconductor body 102 at the first surface 104 as is schematically illustrated in FIG. 1A.

Figures 6A, 6B, 6C, 6D, 6E, 6F, 6G:
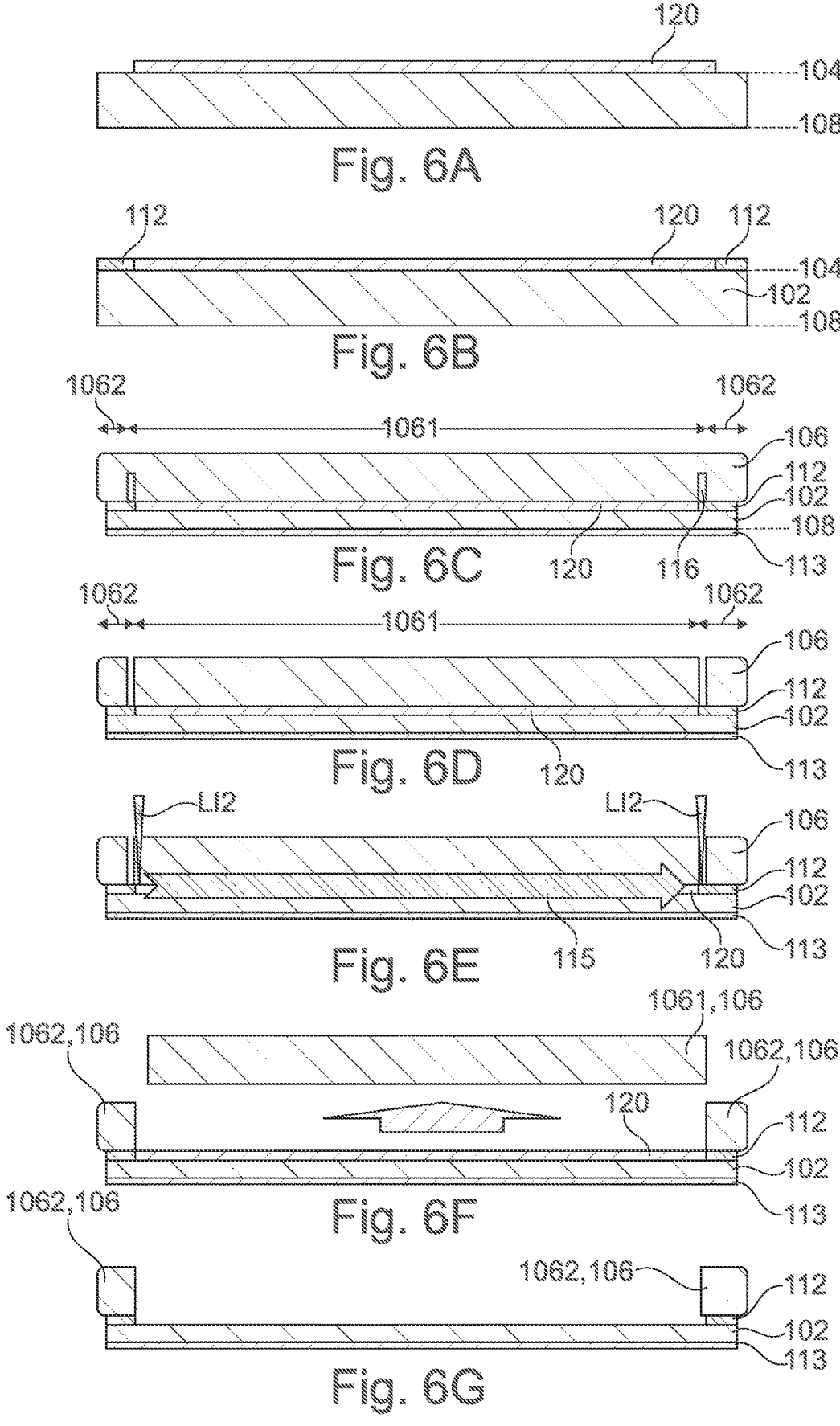

Referring to the schematic cross-sectional view of FIG. 6A, a water soluble layer 120, e.g. a water-soluble resin layer, is formed over the first surface 104 of the semiconductor body 102. The semiconductor body 102 has already been processed at the first surface 104 as is illustrated in simplified form in the schematic cross-sectional view of FIG. 1A. The water soluble layer 120 is absent in an edge part of the semiconductor body 102.

Referring to the schematic cross-sectional view of FIG. 6B, an adhesion layer is formed over the semiconductor body 102 in the edge part of the semiconductor body 102.

Referring to the schematic cross-sectional view of FIG. 6C and similar to the illustration of FIG. 4C, the carrier 106 is attached to the semiconductor body 102 via the surface including the groove 116. The groove 116 is aligned with the adhesion layer 112 in the edge part of the semiconductor body 102. Although the exemplary carrier 106 illustrated in FIG. 6C includes the groove 116, also other carriers, e.g. carriers without the groove (see, for example, FIG. 3A) may be used. Processing of the semiconductor body 102 at the second surface 108 may include, inter alia, reducing a thickness of the semiconductor body 102, and forming a contact layer 113, e.g. a metallization layer or metallization layer stack, on the second surface 108 of the semiconductor body 102.

Separation of the carrier 106 into the inner part 1061 and the outer part 1062 may be carried out by any of the exemplary process features illustrated in FIGS. 4C to 4E or 5A and 5B. If the carrier 106 has no groove 116, the process features of FIGS. 3A to 3D may be carried out. A schematic cross-sectional view of the semiconductor body 102 after lateral separation of the carrier 106 into the inner part 1061 and the outer part 1062 is illustrated in FIG. 6D.

Referring to the schematic cross-sectional view of FIG. 6E and similar to the illustration of FIG. 3D, the water soluble layer 120 is irradiated with laser irradiation LI2 through the carrier 106 in the inner part 106 of the carrier 106 (schematically illustrated by an arrow 115 indicating the scan direction of the laser irradiation LI2). The laser irradiation LI2 in combination with the LTHC layer (arranged between the carrier 106 and the adhesion layer 112) enables a debonding of the carrier 106 from the semiconductor body 102. The laser irradiation LI2 may differ from the laser irradiation LI1 with respect to parameters such as laser wavelength, laser pulse energy, pulse repetition rate, for example.

Referring to the schematic cross-sectional view of FIG. 6F, the inner part 1061 of the carrier 106 is detached from the semiconductor body 102.

Referring to the schematic cross-sectional view of FIG. 6G, the water soluble layer 120 between the inner part 1061 of the carrier 106 and the semiconductor body 102 is removed by dissolving the water soluble layer 120 with water.

Further process features may follow, e.g. accessing the first surface 104 of the semiconductor body for testing as illustrated in FIG. 2, for example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:

processing a semiconductor body at a first surface of the semiconductor body;

attaching the semiconductor body to a carrier via the first surface, the carrier comprising an inner part and an outer part at least partly surrounding the inner part;

processing the semiconductor body at a second surface opposite to the first surface; and detaching the inner part of the carrier from the semiconductor body, wherein detaching the inner part of the carrier from the semiconductor body comprises separating the inner part from the outer part of the carrier by removing material of the carrier, wherein removing the material of the carrier comprises laser irradiating a separation region between the inner part and the outer part of the carrier, wherein the carrier includes a groove on a surface of the carrier in the separation region, and wherein the carrier is attached to the semiconductor body via the surface including the groove.

2. The method of claim 1, further comprising:

testing electric characteristics by bringing at least one probe into electric contact with the semiconductor body from a side of the semiconductor body where the outer part of the carrier is attached to the semiconductor body.

3. The method of claim 1, wherein processing the semiconductor body at the first surface comprises:

introducing dopants into the semiconductor body through the first surface; and/or forming a wiring area including a plurality of contact pads over the first surface of the semiconductor body; and/or forming trenches in the semiconductor body at the first surface.

4. The method of claim 1, wherein processing the semiconductor body at the second surface comprises:

reducing a thickness of the semiconductor body by removing material from the second surface of the semiconductor body.

5. A method of manufacturing a semiconductor device, the method comprising:

processing a semiconductor body at a first surface of the semiconductor body;

attaching the semiconductor body to a carrier via the first surface, the carrier comprising an inner part and an outer part at least partly surrounding the inner part;

processing the semiconductor body at a second surface opposite to the first surface; and detaching the inner part of the carrier from the semiconductor body, wherein detaching the inner part of the carrier from the semiconductor body comprises separating the inner part from the outer part of the carrier by removing material of the carrier, wherein the carrier includes a groove on a surface of the carrier in a separation region between the inner part and the outer part of the carrier, wherein the carrier is attached to the semiconductor body via the surface including the groove, and wherein removing the material of the carrier comprises abrasive machining from a surface opposite to the groove to expose the groove and separate the inner part from the outer part of the carrier.

6. The method of claim 5, further comprising:

testing electric characteristics by bringing at least one probe into electric contact with the semiconductor body from a side of the semiconductor body where the outer part of the carrier is attached to the semiconductor body.

7. The method of claim 5, wherein processing the semiconductor body at the first surface comprises:

introducing dopants into the semiconductor body through the first surface; and/or forming a wiring area including a plurality of contact pads over the first surface of the semiconductor body; and/or forming trenches in the semiconductor body at the first surface.

8. The method of claim 5, wherein processing the semiconductor body at the second surface comprises:

reducing a thickness of the semiconductor body by removing material from the second surface of the semiconductor body.

9. A method of manufacturing a semiconductor device, the method comprising:

processing a semiconductor body at a first surface of the semiconductor body;

attaching the semiconductor body to a carrier via the first surface, the carrier comprising an inner part and an outer part at least partly surrounding the inner part;

processing the semiconductor body at a second surface opposite to the first surface; and detaching the inner part of the carrier from the semiconductor body, wherein detaching the inner part of the carrier from the semiconductor body comprises removing an adhesion layer between the inner part of the carrier and the semiconductor body, by introducing an etch solution into holes extending through the carrier.

10. The method of claim 9, further comprising:

testing electric characteristics by bringing at least one probe into electric contact with the semiconductor body from a side of the semiconductor body where the outer part of the carrier is attached to the semiconductor body.

11. The method of claim 9, wherein processing the semiconductor body at the first surface comprises:

introducing dopants into the semiconductor body through the first surface; and/or forming a wiring area including a plurality of contact pads over the first surface of the semiconductor body; and/or forming trenches in the semiconductor body at the first surface.

12. The method of claim 9, wherein processing the semiconductor body at the second surface comprises:

reducing a thickness of the semiconductor body by removing material from the second surface of the semiconductor body.

13. A method of manufacturing a semiconductor device, the method comprising:

processing a semiconductor body at a first surface of the semiconductor body;

attaching the semiconductor body to a carrier via the first surface, the carrier comprising an inner part and an outer part at least partly surrounding the inner part;

processing the semiconductor body at a second surface opposite to the first surface; and detaching the inner part of the carrier from the semiconductor body, wherein detaching the inner part of the carrier from the semiconductor body comprises removing a water soluble layer between the inner part of the carrier and the semiconductor body, by dissolving the water soluble layer with water.

14. The method of claim 13, further comprising:

testing electric characteristics by bringing at least one probe into electric contact with the semiconductor body from a side of the semiconductor body where the outer part of the carrier is attached to the semiconductor body.

15. The method of claim 13, wherein processing the semiconductor body at the first surface comprises:

introducing dopants into the semiconductor body through the first surface; and/or forming a wiring area including a plurality of contact pads over the first surface of the semiconductor body; and/or forming trenches in the semiconductor body at the first surface.

16. The method of claim 13, wherein processing the semiconductor body at the second surface comprises:

reducing a thickness of the semiconductor body by removing material from the second surface of the semiconductor body.

\* \* \* \* \*